(12) United States Patent
Kramer et al.

(10) Patent No.: US 10,705,426 B2
(45) Date of Patent: Jul. 7, 2020

(54) EXTRACTION BODY FOR LITHOGRAPHIC APPARATUS

(71) Applicant: ASML NETHERLANDS B.V., Veldhoven (NL)

(72) Inventors: Gijs Kramer, Nijmegen (NL); Martijn Houben, 's-Hertogenbosch (NL); Nicholas Peter Waterson, Duizel (NL); Thibault Simon Mathieu Laurent, Eindhoven (NL); Yuri Johannes Gabriël Van De Vijver, Best (NL); Marcus Martinus Petrus Adrianus Vermeulen, Leende (NL); Simon Karel Ravensbergen, Veldhoven (NL); Vincentius Fransiscus Cloosterman, Eindhoven (NL); Siegfried Alexander Tromp, Knegsel (NL); Coen Hubertus Matheus Baltis, Eindhoven (NL); Justin Johannes Hermanus Gerritzen, Veldhoven (NL); Niek Jacobus Johannes Roset, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/097,640

(22) PCT Filed: Apr. 5, 2017

(86) PCT No.: PCT/EP2017/058076
§ 371 (c)(1),
(2) Date: Oct. 30, 2018

(87) PCT Pub. No.: WO2017/194247
PCT Pub. Date: Nov. 16, 2017

(65) Prior Publication Data
US 2019/0163066 A1    May 30, 2019

(30) Foreign Application Priority Data

May 12, 2016  (EP) .................................... 16169457

(51) Int. Cl.
*G03F 7/20*        (2006.01)
(52) U.S. Cl.
CPC ............ *G03F 7/2041* (2013.01); *G03F 7/707* (2013.01); *G03F 7/70341* (2013.01); *G03F 7/70716* (2013.01); *G03F 7/70733* (2013.01)
(58) Field of Classification Search
CPC .... G03F 7/70341; G03F 7/707; G03F 7/2041; G03F 7/70716; G03F 7/70733
See application file for complete search history.

(56) References Cited

U.S. PATENT DOCUMENTS 4,509,852 A     4/1985  Tabarelli et al.
9,176,393 B2 *  11/2015 Cloin ................ G03F 7/70341
(Continued)

FOREIGN PATENT DOCUMENTS

EP     1420298      5/2004
EP     1429188      6/2004
(Continued)

OTHER PUBLICATIONS

International Search Report and Written Opinion issued in corresponding PCT Patent Application No. PCT/EP2017/058076, dated Jul. 20, 2017.

(Continued)

*Primary Examiner* — Deoram Persaud
(74) *Attorney, Agent, or Firm* — Pillsbury Winthrop Shaw Pittman, LLP

(57) ABSTRACT

An extraction body for a support apparatus of a lithographic apparatus. The support apparatus is configured to support an object. The extraction body is formed with an opening at a surface thereof. The opening extends within the extraction (Continued)

body forming a first passageway. The first passageway is configured to fluidly communicate an extraction channel in the extraction body to liquid between the surface and the object. A first pressure in the extraction channel is less than ambient pressure. At least a part of the first passageway is sized and dimensioned such that when the liquid enters the first passageway via the opening, a second pressure in the first passageway associated with surface tension of the liquid is lower than the first pressure such that at least a portion of the liquid is retained in the first passageway.

20 Claims, 14 Drawing Sheets

(56) References Cited

U.S. PATENT DOCUMENTS

| | | | | |
|---|---|---|---|---|
| 9,329,496 | B2* | 5/2016 | Sato | G03F 7/70716 |
| 9,507,275 | B2* | 11/2016 | Lafarre | G03F 7/70716 |
| 9,785,055 | B2* | 10/2017 | Laurent | G03F 7/70341 |
| 2004/0160582 | A1* | 8/2004 | Lof | G03F 7/70341 355/30 |
| 2004/0207824 | A1 | 10/2004 | Lof et al. | |
| 2006/0139614 | A1* | 6/2006 | Owa | G03B 27/58 355/72 |
| 2007/0109521 | A1* | 5/2007 | Nishii | G03F 7/70341 355/72 |
| 2007/0177125 | A1* | 8/2007 | Shibazaki | G03F 7/70341 355/72 |
| 2009/0040481 | A1* | 2/2009 | Nishikawara | G03F 7/70341 355/30 |
| 2009/0296056 | A1* | 12/2009 | Mondt | G03F 7/70341 355/30 |
| 2010/0045949 | A1 | 2/2010 | Nakano et al. | |
| 2010/0149501 | A1* | 6/2010 | Kemper | G03F 7/70341 355/30 |
| 2010/0277709 | A1 | 11/2010 | Stavenga et al. | |
| 2011/0181849 | A1* | 7/2011 | Patel | G03F 7/70341 355/30 |
| 2011/0242512 | A1 | 10/2011 | Kemper et al. | |
| 2012/0154781 | A1 | 6/2012 | Ten Kate et al. | |
| 2015/0109599 | A1 | 4/2015 | Koevoets et al. | |
| 2018/0107107 | A1* | 4/2018 | Kramer | G03F 7/70341 |
| 2018/0231897 | A1* | 8/2018 | Jeunink | G03F 7/70875 |

FOREIGN PATENT DOCUMENTS

| | | |
|---|---|---|
| EP | 1788617 | 5/2007 |
| EP | 1801850 | 6/2007 |
| JP | 200878623 | 4/2008 |
| JP | 2008-227452 A | 9/2008 |
| JP | 2009-260264 A | 11/2009 |
| JP | 2010-219525 A | 9/2010 |
| JP | 2012-119720 A | 6/2012 |
| JP | 2015-163970 A | 9/2015 |
| KR | 20070107935 | 11/2007 |
| WO | 9949504 | 9/1999 |
| WO | 2013178484 | 12/2013 |

OTHER PUBLICATIONS

Notice of Reasons for Rejection dated Oct. 29, 2019 issued in corresponding Japanese Patent Application No. 2018-554723.

* cited by examiner

EXTRACTION BODY FOR LITHOGRAPHIC APPARATUS

CROSS-REFERENCE TO RELATED APPLICATIONS

This application is the U.S. national phase entry of PCT patent application no. PCT/EP2017/058076, which was filed on Apr. 5, 2017, which claims the benefit of priority of European patent application no. 16169457.5, which was filed on May 12 2016, and which is incorporated herein in its entirety by reference.

FIELD

The present invention relates to an extraction body, a support apparatus, a lithographic apparatus, a method of supporting an object and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is ultra-pure water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and support table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a bather to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In an immersion apparatus, a substrate is clamped to a support table during exposure processes. When the fluid handling structure crosses the edge of the substrate, liquid, e.g., water can reach down the side of the substrate and can flow at least part of the way under the substrate. It is desirable to reduce the amount of liquid that reaches the underside of the substrate.

According to an aspect of the invention, there is provided an extraction body for a support apparatus of a lithographic apparatus, the support apparatus configured to support an object, wherein the extraction body is formed with an opening at a surface thereof, the opening extending within the extraction body forming a first passageway, and the first passageway configured to fluidly communicate an extraction channel in the extraction body to liquid between the surface and the object, wherein a first pressure in the extraction channel is less than ambient pressure; characterised in that at least a part of the first passageway is sized and dimensioned such that when the liquid enters the first passageway via the opening, a second pressure in the first passageway associated with surface tension of the liquid is lower than the first pressure such that at least a portion of the liquid is retained in the first passageway.

According to an aspect of the invention, there is provided a support apparatus for a lithographic apparatus, comprising: an object holder configured to support an object; and an extraction body radially outward of the object holder and spaced from the object holder such that the extraction body is substantially decoupled from the object holder, wherein the extraction body comprises: an extraction channel in the extraction body; an opening formed on a surface of the extraction body, the opening extending within the extraction body forming a first passageway and the first passageway configured to fluidly communicate the extraction channel to liquid between the surface and the object, wherein a first pressure in the extraction channel is less than ambient pressure; and a second passageway configured to extract fluid from the surface; wherein the extraction channel is in fluid communication with both the first passageway and the second passageway.

According to an aspect of the invention, there is provided a support apparatus for a lithographic apparatus, comprising: an object holder configured to support an object, wherein the object holder comprises: a base surface; and a plurality of burls protruding above the base surface, each of the plurality of burls having a respective burl distal end, the burl distal ends being arranged in a support plane so as to support the object; and an extraction body radially outward of the object holder and spaced from the object holder such that the extraction body is substantially decoupled from the object holder, wherein the extraction body comprises: an extraction channel in the extraction body; and an opening formed on a surface of the extraction body, the opening extending within the extraction body forming a first passageway and the first passageway configured to communicate the extraction channel to a liquid between the surface and the object, wherein the support apparatus is arranged such that $D < 4h \cos \theta/(1+\cos \theta)$ and $\theta \leq 45°$, where D is a diameter of the first passageway, h is a minimum distance between the first passageway and the support plane and $\theta$ is a contact angle to the liquid of an inner surface of the first passageway.

According to an aspect of the invention, there is provided a method of supporting an object on a support apparatus comprising an object holder configured to support the object and an extraction body radially outward of the object holder and spaced from the object holder such that the extraction body is substantially decoupled from the object holder, the method comprising: extracting a liquid through a first passageway of the extraction body to an extraction channel in the extraction body, wherein the liquid enters the first passageway via an opening at a surface of the extraction body, the opening extending within the extraction body forming the first passageway; wherein a first pressure in the extraction channel is less than ambient pressure; wherein at least a part of the first passageway is sized and dimensioned such that when the liquid enters the first passageway via the opening, a second pressure in the first passageway associated with surface tension of the liquid is lower than the first pressure such that at least a portion of the liquid is retained in the first passageway.

According to an aspect of the invention, there is provided a method of supporting an object on a support apparatus comprising an object holder configured to support the object and an extraction body radially outward of the object holder and spaced from the object holder such that the extraction body is substantially decoupled from the object holder, the method comprising: extracting a liquid through a first passageway of the extraction body to an extraction channel in the extraction body, wherein the liquid enters the first passageway via an opening at a surface of the extraction body, the opening extending within the extraction body forming the first passageway; and extracting fluid through a second passageway from the surface of the extraction body; wherein the extraction channel in the extraction body is in fluid communication with both the first passageway and the second passageway.

According to an aspect of the invention, there is provided a method of supporting an object on a support apparatus comprising an object holder configured to support the object and an extraction body radially outward of the object holder and spaced from the object holder such that the extraction body is substantially decoupled from the object holder, the method comprising: extracting fluid through a first passageway of the extraction body from a top surface of the extraction body to an extraction channel in the extraction body; wherein the object holder comprises: a base surface; and a plurality of burls protruding above the base surface, each of the plurality of burls having a respective burl distal end, the burl distal ends being arranged in a support plane so as to support the object; wherein the extraction body comprises: an extraction channel in the extraction body; and the first passageway configured to communicate the extraction channel to fluid at a top surface of the extraction body, wherein the support apparatus is arranged such that $D < 4h \cos \theta/(1+\cos \theta)$ and $\theta \leq 45°$, where D is a diameter of the first passageway, h is a minimum distance between the first passageway and the support plane and $\theta$ is a contact angle to the liquid of an inner surface of the first passageway.

According to an aspect of the invention, there is provided a device manufacturing method using a lithographic apparatus, the method comprising: projecting a beam patterned by a patterning device onto a substrate while supporting the substrate with a support apparatus, wherein the support apparatus comprises: an object holder configured to support an object; and an extraction body radially outward of the object holder, the extraction body comprising a first passageway configured to extract a liquid to an extraction channel in the extraction body, wherein the liquid enters the first passageway via an opening at a surface of the extraction body, the opening extending within the extraction body forming the first passageway; wherein a first pressure in the extraction channel is less than ambient pressure; wherein at least a part of the first passageway is sized and dimensioned such that when the liquid enters the first passageway via the opening, a second pressure in the first passageway associated with surface tension of the liquid is lower than the first pressure such that at least a portion of the liquid is retained in the first passageway.

According to an aspect of the invention, there is provided a device manufacturing method using a lithographic apparatus, the method comprising: projecting a beam patterned by a patterning device onto a substrate while supporting the substrate with a support apparatus, wherein the support apparatus comprises: an object holder; and an extraction body radially outward of the object holder and spaced from the object holder such that the extraction body is substantially decoupled from the object holder, the extraction body comprising: an extraction channel in the extraction body; a first passageway configured to extract a liquid to the extraction channel in the extraction body, wherein the liquid enters the first passageway via an opening at a surface of the extraction body, the opening extending within the extraction body forming the first passageway; and a second passageway configured to extract fluid from the surface of the extraction body; wherein the extraction channel in the extraction body is in fluid communication with both the first passageway and the second passageway.

According to an aspect of the invention, there is provided a device manufacturing method using a lithographic apparatus, the method comprising: projecting a beam patterned by a patterning device onto a substrate while supporting the substrate with a support apparatus, wherein the support apparatus comprises: an object holder comprising: a base surface; and a plurality of burls protruding above the base surface, each of the plurality of burls having a respective burl distal end, the burl distal ends being arranged in a support plane so as to support the substrate; and an extraction body radially outward of the object holder and spaced from the object holder such that the extraction body is substantially decoupled from the object holder, the extraction body comprising: an extraction channel in the extraction body; and an opening formed on a surface of the extraction body, the opening extending within the extraction body forming a first passageway and the first passageway configured to communicate the extraction channel to a liquid between the surface and the object, wherein the support apparatus is arranged such that $D<4h \cos \theta/(1+\cos \theta)$ and $\theta \leq 45°$, where D is a diameter of the first passageway, h is a minimum distance between the first passageway and the support plane and $\theta$ is a contact angle to the liquid of an inner surface of the first passageway.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 20 schematically depicts the relationship between pressure in different parts of the support apparatus and the contact angle of the material of the support apparatus for water;

DETAILED DESCRIPTION

Figure 1:
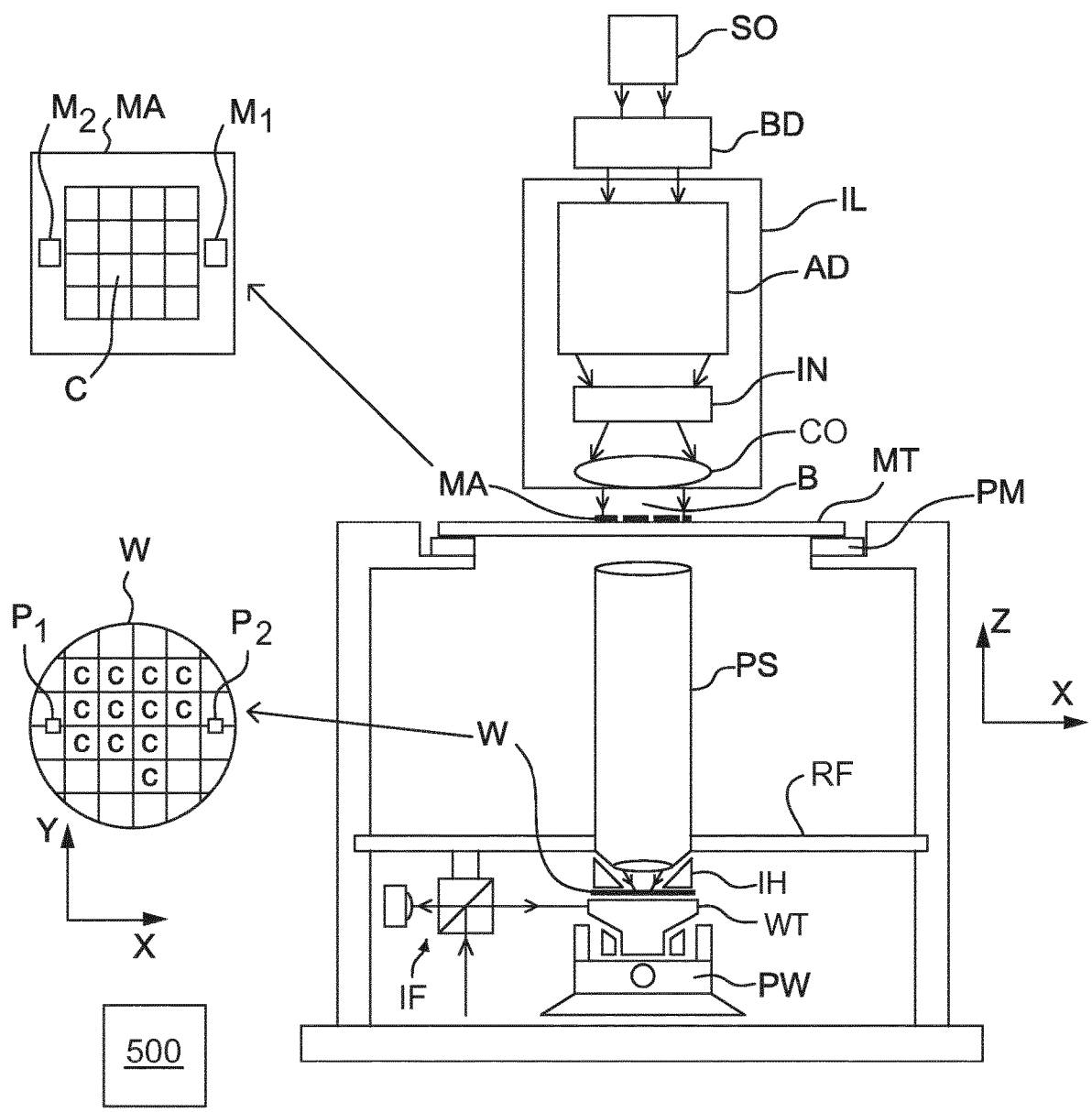
FIG. 1 depicts a lithographic apparatus according to an embodiment of the invention.

FIG. 1 schematically depicts a lithographic apparatus according to one embodiment of the invention. The apparatus comprises:

a. an illumination system (illuminator) IL configured to condition a radiation beam B (e.g. UV radiation or DUV radiation);

b. a support structure (e.g. a mask table) MT constructed to support a patterning device (e.g. a mask) MA and connected to a first positioner PM configured to accurately position the patterning device MA in accordance with certain parameters;

c. a support table, e.g. a sensor table to support one or more sensors or a support table WT constructed to hold a substrate (e.g. a resist-coated substrate) W, connected to a second positioner PW configured to accurately position the surface of the table, for example of a substrate W, in accordance with certain parameters; and d. a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two or more tables (or stage or support), e.g., two or more support tables or a combination of one or more support tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or supports) which may be used in parallel in a similar manner to substrate, cleaning, sensor and/or measurement tables.

Referring to FIG. 1, the illumination system IL receives a radiation beam from a source SO or radiation. The source SO and the lithographic apparatus may be separate entities, for example when the source SO is an excimer laser. In such cases, the source SO is not considered to form part of the lithographic apparatus and the radiation beam is passed from the source SO to the illumination system IL with the aid of a beam delivery system BD comprising, for example, suitable directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam, to have a desired uniformity and intensity distribution in its cross-section. Similar to the source SO, the illumination system IL may or may not be considered to form part of the lithographic apparatus. For example, the illumination system IL may be an integral part of the lithographic apparatus or may be a separate entity from the lithographic apparatus. In the latter case, the lithographic apparatus may be configured to allow the illumination system IL to be mounted thereon. Optionally, the illumination system IL is detachable and may be separately provided (for example, by the lithographic apparatus manufacturer or another supplier).

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the support table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the support table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks M1, M2 as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the support table WT is submersed in a bath of liquid.

Figure 2:
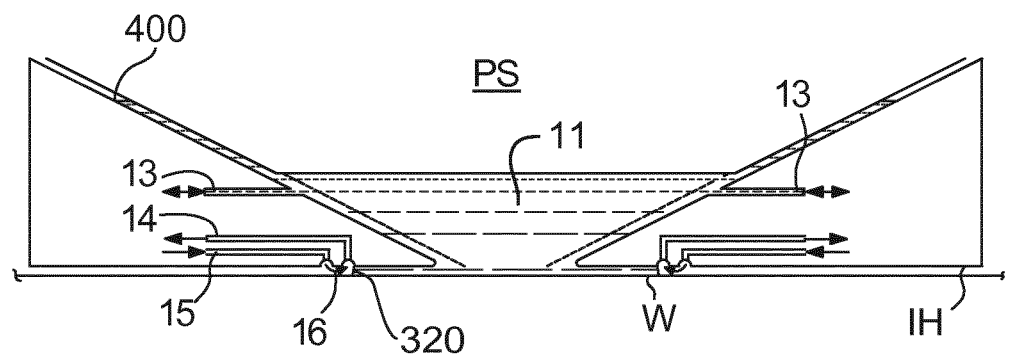
FIG. 2 depicts a liquid supply system for use in a lithographic projection apparatus.
Figure 3:
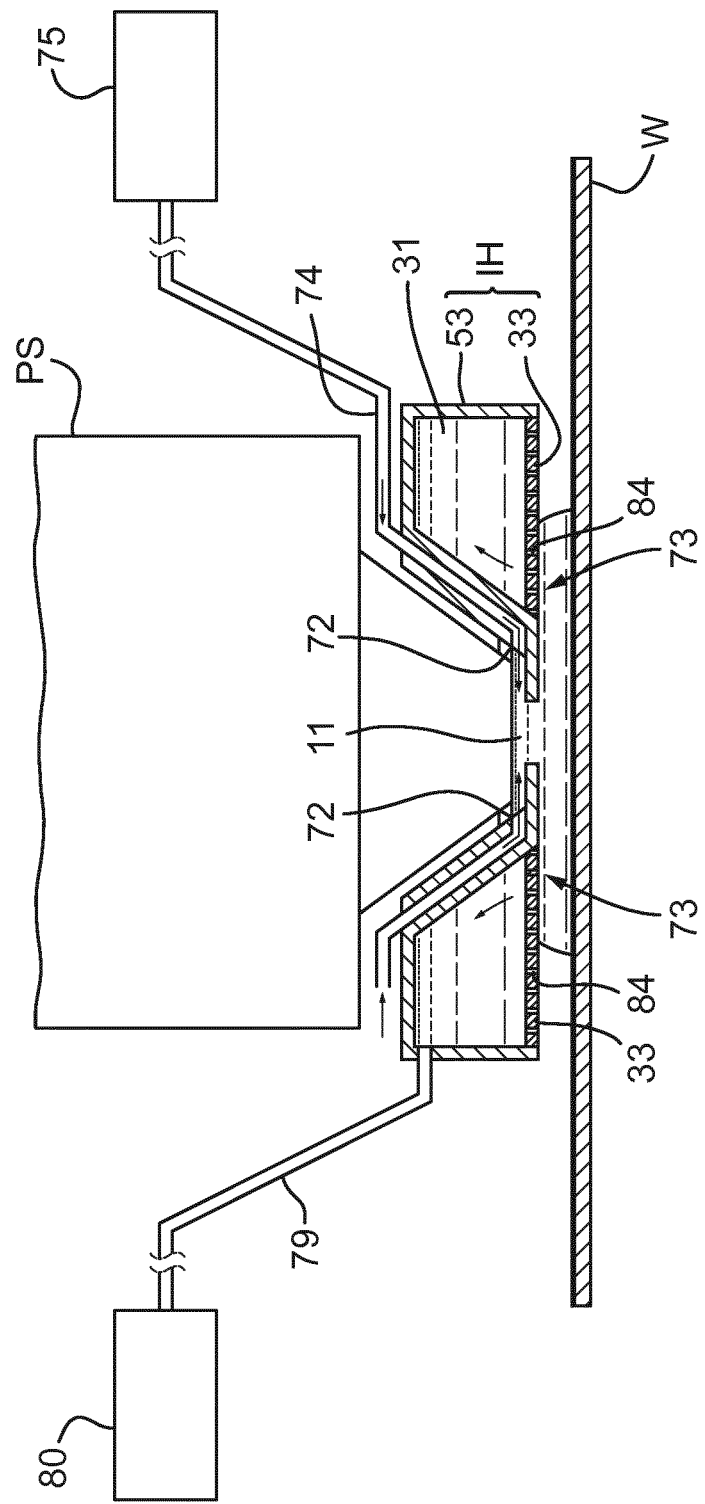
FIG. 3 is a side cross sectional view that depicts a further liquid supply system according to an embodiment.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2 and 3 show different supply devices which can be used in such a system. A sealing feature is present to seal liquid to the localized area. One way which has been proposed to arrange for this is disclosed in PCT patent application publication no. WO 99/49504.

An arrangement which has been proposed is to provide the liquid supply system with a liquid confinement structure which extends along at least a part of a boundary of a space between the final element of the projection system and the support table. Such an arrangement is illustrated in FIG. 2.

FIG. 2 schematically depicts a localized liquid supply system or fluid handling system. The liquid supply system is provided with a fluid handling structure IH (or liquid confinement structure), which extends along at least a part of a boundary of the space 11 between the final element of the projection system PS and the support table WT or substrate W. (Please note that reference in the following text to surface of the substrate W also refers in addition or in the alternative to a surface of the support table WT, unless expressly stated otherwise.) The fluid handling structure IH is substantially stationary relative to the projection system PS in the XY plane though there may be some relative movement in the Z direction (in the direction of the optical axis). In an embodiment, a seal is formed between the fluid handling structure IH and the surface of the substrate W and may be a contactless seal such as a gas seal (such a system with a gas seal is disclosed in European patent application publication no. EP-A-1,420,298) or liquid seal.

The fluid handling structure IH at least partly confines liquid in the space 11 between the final element of the projection system PS and the substrate W. A contactless seal to the substrate W may be formed around the image field of the projection system PS so that liquid is confined within the space 11 between the substrate W surface and the final element of the projection system PS. The space 11 is at least partly formed by the fluid handling structure IH positioned below and surrounding the final element of the projection system PS. Liquid is brought into the space 11 below the projection system PS and within the fluid handling structure IH by one of liquid openings 13. The liquid may be removed by another of liquid openings 13. The liquid may be brought into the space 11 through at least two liquid openings 13. Which of liquid openings 13 is used to supply the liquid and optionally which is used to remove the liquid may depend on the direction of motion of the support table WT. The fluid handling structure IH may extend a little above the final element of the projection system PS. The liquid level rises above the final element so that a buffer of liquid is provided. In an embodiment, the fluid handling structure IH has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be confined in the space 11 by a gas seal 16 which, during use, is formed between the bottom of the fluid handling structure IH and the surface of the substrate W. The gas seal 16 is formed by gas. The gas in the gas seal 16 is provided under pressure via inlet 15 to the gap between the fluid handling structure IH and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid handling structure IH and the substrate W confines the liquid in the space 11. The inlets/outlets may be annular grooves which surround the space 11. The annular grooves may be continuous or discontinuous. The flow of gas is effective to confine the liquid in the space 11. Such a system is disclosed in United States patent application publication no. US 2004-0207824, which is hereby incorporated by reference in its entirety. In an embodiment, the fluid handling structure IH does not have the gas seal 16.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a fluid handling structure IH (or a liquid confinement structure), which extends along at least a part of a boundary of the space 11 between the final element of the projection system PS and the support table WT or substrate W. (Please note that reference in the following text to surface of the substrate W also refers in addition or in the alternative to a surface of the support table WT, unless expressly stated otherwise.)

The fluid handling structure IH at least partly confines liquid in the space 11 between the final element of the projection system PS and the substrate W. The space 11 is at least partly formed by the fluid handling structure IH positioned below and surrounding the final element of the projection system PS. In an embodiment, the fluid handling structure IH comprises a main body member 53 and a porous member 33. The porous member 33 is plate shaped and has a plurality of holes (i.e., openings or pores). In an embodiment, the porous member 33 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid recovered via the recovery port 73 through the passageway 29. The porous member 33 is disposed in the recovery port 73.

In an embodiment, to form the space 11 with the liquid between the projection system PS and the fluid handling structure IH on one side and the substrate W on the other side, liquid is supplied from the supply ports 72 to the space 11 and the pressure in a recovery chamber 31 in the fluid handling structure IH is adjusted to a negative pressure so as to recover the liquid via the holes 84 (i.e., the recovery port 73) of the porous member 33. Performing the liquid supply operation using the supply ports 72 and the liquid recovery operation using the porous member 33 forms the space 11 between the projection system PS and the fluid handling structure IH on one side and the substrate W on the other side.

Figure 4:
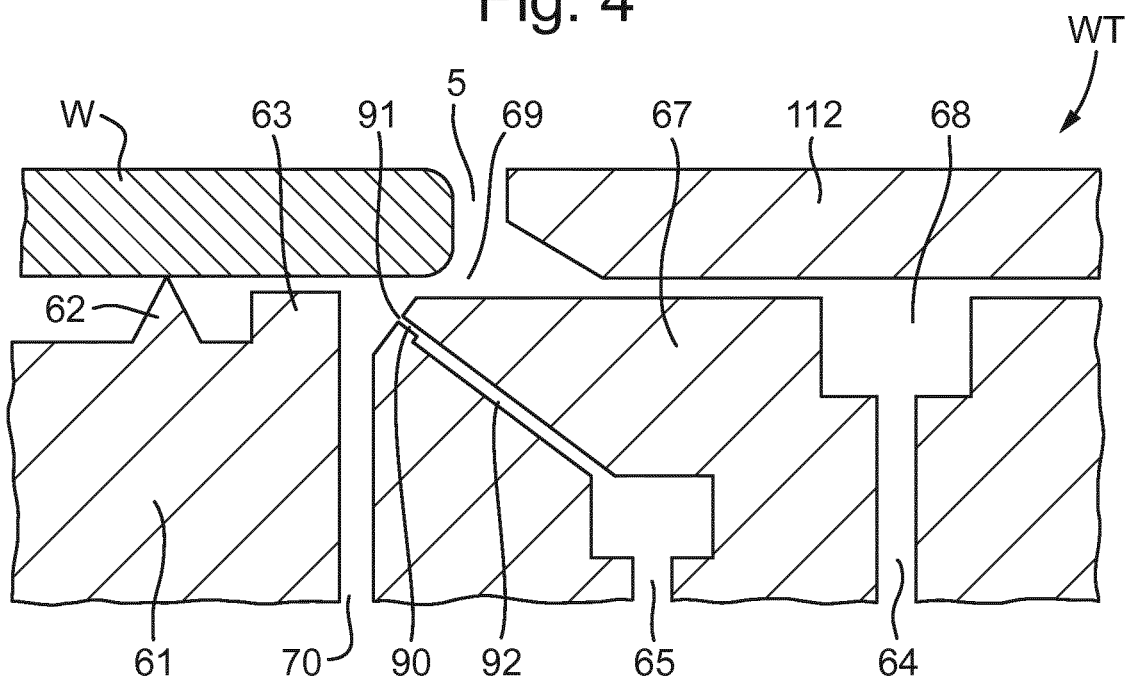
FIGS. 4 to 6 each schematically depict an extraction body in cross-section according to an embodiment of the invention.

FIG. 4 schematically depicts in cross-section part of an extraction body 67 according to an embodiment of the invention. The extraction body 67 is for a support apparatus of a lithographic apparatus. In the description below, a support table WT constructed to hold a substrate W is given as an example of the support apparatus. However, the support apparatus may alternatively be embodied as a support structure MT constructed to support a patterning device MA, for example. The support apparatus (e.g. support table WT) is configured to support an object (e.g. a substrate W).

As depicted in FIG. 4, the extraction body 67 is formed with an opening 91 at a surface 69 of the extraction body 67. In an embodiment the opening 91 is provided at the top surface of the extraction body 67. As shown in FIG. 4, the opening 91 may be provided at a slanted surface facing upwards from the extraction body 67.

As depicted in FIG. 4, in an embodiment the opening 91 extends within the extraction body 67. The opening 91 is configured to form a first passageway 90. In an embodiment the extraction body 67 comprises an extraction channel 65 in the extraction body 67. The first passageway 90 is configured to fluidly communicate the extraction channel 65 in the extraction body 67 to liquid between the surface 69 of the extraction body 67 and the substrate W. The extraction body 67 is configured to extract liquid from the surface 69 of the extraction body 67 via an underpressure in the extraction channel 65.

A first pressure p1 in the extraction channel 65 is less than the ambient pressure p0. The first pressure p1 in the extraction channel 65 is an underpressure. In an embodiment the ambient pressure p0 is atmospheric pressure. In an embodiment the first pressure p1 is less than atmospheric pressure. For example, in an embodiment the ambient pressure p0 is 100 kPa (absolute pressure) and the first pressure p1 is in the region of from about 98 kPa to about 99 kPa (absolute pressure).

As depicted in FIG. 4, the opening 91 is narrow. The first passageway 90 is configured to function as a capillary. In an embodiment at least a part of the first passageway 90 is sized and dimensioned such that when the liquid enters the first passageway 90 via the opening 91, a second pressure p2 in the first passageway 90 associated with surface tension of the liquid is lower than the first pressure p1 such that at least a portion of the liquid is retained in the first passageway 90. The first passageway 90 functions as a capillary. The pressure inside a capillary, such as the first passageway 90, is reduced due to surface tension of the liquid.

In an embodiment the first passageway 90 is configured to stay wet during use of the lithographic apparatus. The first pressure p1 in the extraction channel 65 is controlled to be not sufficiently low to extract all of the liquid from the first passageway 90.

As depicted in FIG. 4, in an embodiment the support table WT comprises the extraction body 67 and an object holder 61. The object holder 61 is configured to support the substrate W. The extraction body 67 is radially outward of the object holder 61. The extraction body 67 surrounds the object holder 61 in plan view. The extraction body 67 is spaced from the object holder 61 such that the extraction body 67 is substantially decoupled from the object holder 61. As depicted in FIG. 4, in an embodiment an intermediate space 70 exists between the object holder 61 and the extraction body 67. The intermediate space 70 is a gap in the radial direction. The gap extends circumferentially. An embodiment of the invention is expected to reduce the amount of the liquid, e.g., water, in the intermediate space 70.

The extraction body 67 is configured to function without high flow through the first passageway 90. In particular, the flow is not high enough to remove liquid from the first passageway 90. This reduces the negative thermal impact that high flow can have on the extraction body 67. In particular, if there is a high flow through the extraction body 67, then the high flow can undesirably increase differences in temperature between different parts of the extraction body 67, which can lead to undesirable deformation of the extraction body 67.

When the fluid handling structure IH passes over the edge of the substrate W, liquid can pass through the gap 5 and subsequently flow on the surface 69 of the extraction body 67 towards the object holder 61. The liquid can flow through between the surface 69 of the extraction body 67 and the substrate W. The extraction body 67 is configured to extract any liquid that passes between the surface 69 of the extraction body 67 and the substrate W and comes over the opening 91. This liquid can be sucked away through the extraction channel 65. However, when liquid is not flowing over the opening 91, the first passageway 90 stays wet because the underpressure in the extraction channel 65 is not sufficient to force the liquid through the first passageway 90 towards the extraction channel 65.

Figure 7:
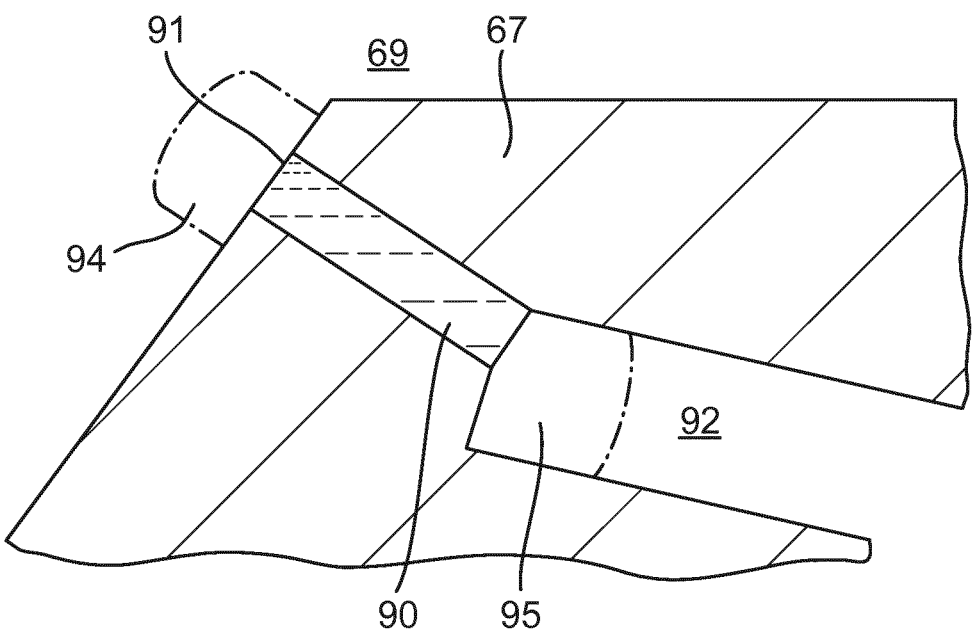
FIGS. 7 and 8 schematically depict a close-up of the opening shown in FIGS. 4 to 6.

FIG. 7 schematically depicts a close-up view of the first passageway 90. FIG. 7 shows an instance in which liquid is in the first passageway 90. The first passageway 90 functions as a capillary. A certain amount of force is required in order to force the liquid through the first passageway 90. An external region of gas 94 is adjacent to the opening 91 and is external to the extraction body 67. The external region of gas 94 is adjacent to the surface 69 of the extraction body 67. An internal region of gas 95 is adjacent to the other end of the first passageway 90 and is internal to the extraction body 67. The internal region of gas 95 is in communication with the extraction channel 65. There is a pressure difference between the external region of gas 94 and the internal region of gas 95. The pressure at the external region of gas 94 is greater than the pressure at the internal region of gas 95. However, the pressure difference between the external region of gas 94 and the internal region of gas 95 is less than the force required to force the liquid through the first passageway 90. Accordingly, the liquid remains in the first passageway 90, such that the first passageway 90 stays wet.

Figure 8:
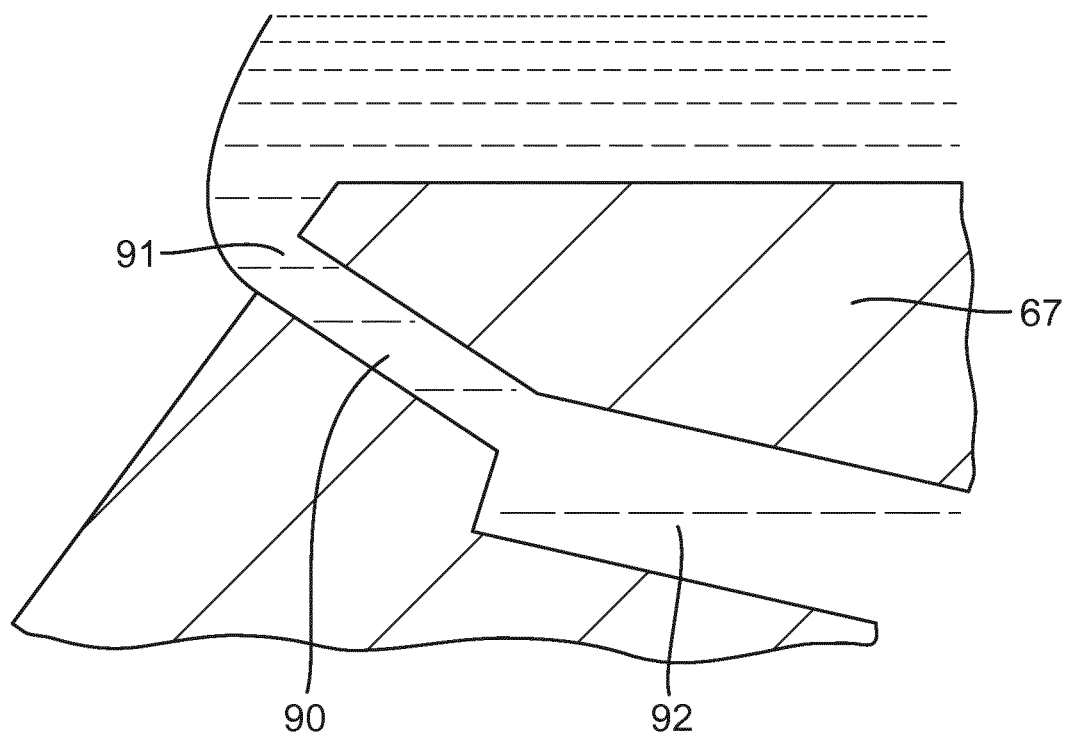

FIG. 8 schematically depicts another close-up of the first passageway 90. FIG. 8 depicts an instance in which liquid, e.g., water, flows over the opening 91. When liquid flows over the opening 91, the liquid is extracted through the first passageway 90. The liquid is extracted when it flows over the opening 91 whereas the opening 91 stays wet when no liquid flows over the opening 91. This is explained in further detail with reference to FIGS. 16 to 20.

Figure 16:
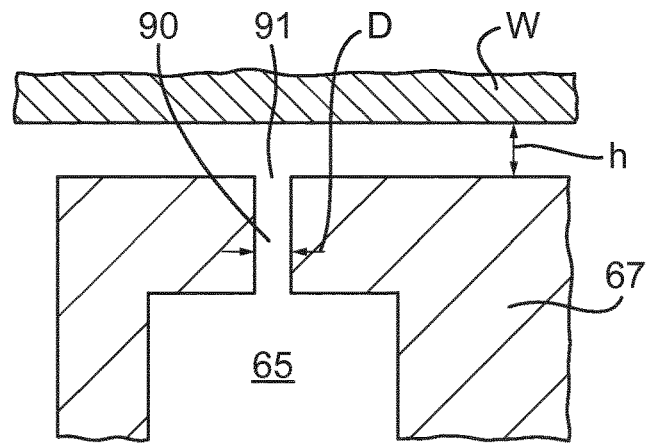
FIGS. 16 to 20 schematically depict the opening of an extraction body according to an embodiment of the invention.

FIG. 16 schematically depicts a substrate W supported by a support table WT that comprises the extraction body 67. The extraction body 67 comprises the opening 91 and the first passageway 90, which is in fluid communication with the extraction channel 65.

Figure 17:
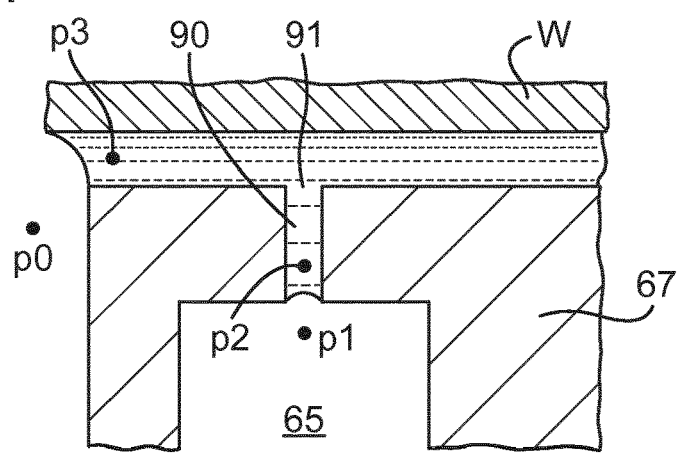

FIG. 17 schematically depicts a moment in which the fluid handling structure IH relatively crosses over the edge of the substrate W. Liquid enters between the substrate W and the extraction body 67. The liquid can reach the edge of the extraction body 67 and can enter into the first passageway 90 via the opening 91.

Figure 18:
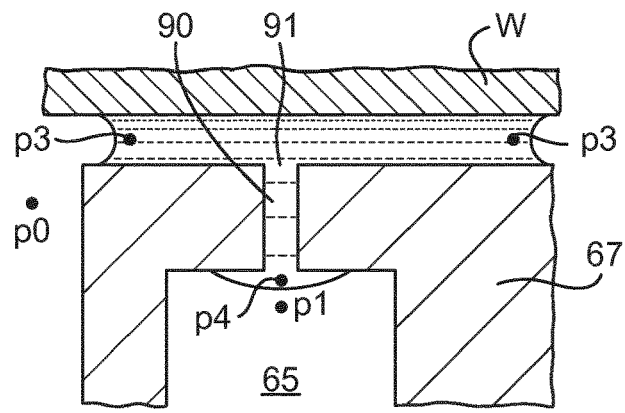
Figure 19:
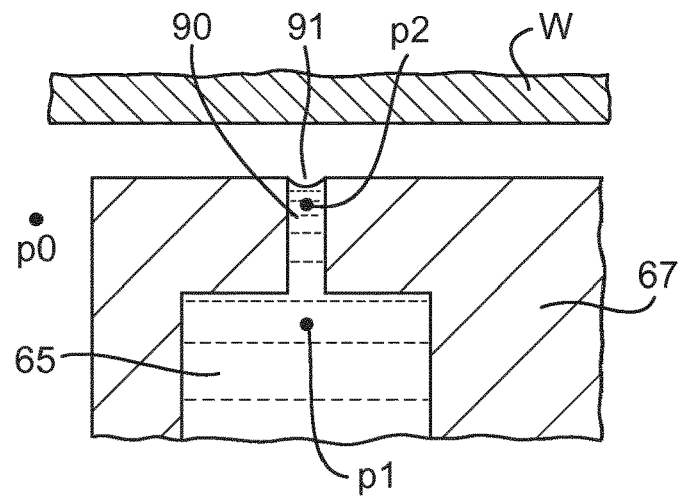

As depicted in FIG. 18, the liquid is then sucked into the extraction channel 65. As depicted in FIG. 19, all or most of the liquid between the substrate W and the extraction body 67 is removed through the extraction channel 65.

Figure 20:
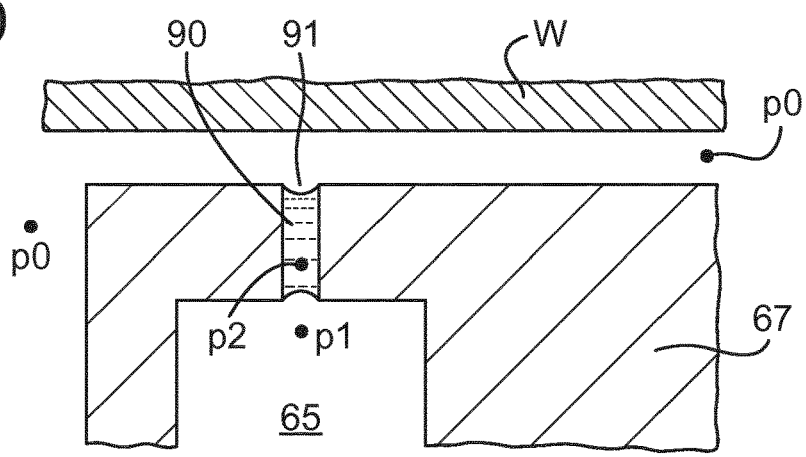

FIG. 20 depicts a later moment in time. As depicted in FIG. 20, liquid is left in the first passageway 90. This is because the pressure difference between the ambient pressure p0 and the first pressure p1 in the extraction channel 65 is smaller than the force required to force the liquid through the first passageway 90. Nevertheless, any liquid passing over the opening 91 will immediately be sucked into the first passageway 90.

In an embodiment the extraction channel 65 is connected to a source of underpressure. In an embodiment the support table WT comprises a controller 500 (shown in FIG. 1) configured to control the source of underpressure. The first pressure p1 in the extraction channel 65 can be controlled.

The second pressure p2 in the first passageway 90 associated with surface tension is less than the ambient pressure p0 because of surface tension. For the first passageway 90, the following equation holds: $p2 = p0 - 4\sigma \cos\theta/D$. $\sigma$ is the surface tension. $\theta$ is the contact angle to the liquid (e.g.

water) of the inside surface of the first passageway 90. The inside surface of the first passageway 90 may comprise the material that the extraction body 67 is made from. The contact angle θ may be a static receding contact angle. D represents the diameter of the first passageway 90 and the opening 91. Hence, when the diameter D of the first passageway 90 is narrower, the second pressure p2 in the first passageway 90 associated with surface tension is lower. When the surface tension σ is greater, the second pressure p2 is lower. When the contact angle θ is lower, the second pressure p2 is lower. Merely as an example, for a perfectly wetting surface in which θ=0° and the diameter D is 50 μm, the second pressure p2 may be 94.4 kPa (absolute pressure). The second pressure p2 associated with surface tension of the liquid is lower than the first pressure p1 in the extraction channel 65, which may be about 98.5 kPa (absolute pressure).

In FIG. 18, the third pressure p3 represents the pressure at the meniscus of the liquid, e.g., water, between the extraction body 67 and the substrate W. For the third pressure p3 at the meniscus, the following equation holds: p3=p0−(cos θ+cos α)σ/h. α represents the contact angle of the substrate W to the liquid. h represents the vertical distance between the extraction body 67 and the substrate W. Merely as an example, if the inner surface of the first passageway 90 is perfectly wetting (θ=0°), the substrate W is perfectly wetting (α=0°) and the vertical distance h between the extraction body 67 and the substrate W is 50 μm, then the pressure p3 at the meniscus may be about 97.2 kPa (absolute pressure).

With reference to FIG. 18, in order for the liquid to move into the extraction channel 65, a minimum pressure p4 needs to be overcome which is given by 4σ cos(θ−π/2)/D. Once the liquid starts flowing into the extraction channel 65, as long as the first pressure p1 is less than the third pressure p3 at the meniscus, then all of the water can be removed from between the extraction body 67 and the substrate W. However, the second pressure p2 associated with surface tension is less than the first pressure p1 in the extraction channel 65 such that some liquid still remains in the first passageway 90.

In an embodiment the extraction body 67 is configured such that the first pressure p1 is lower than the third pressure p3 at the meniscus of the liquid associated with surface tension of the liquid, such that the liquid can be removed through the first passageway 90 into the extraction channel 65.

The removal of the liquid is possible where the pressure in the first passageway 90 is greater than the force required for the liquid to move into the extraction channel 65. In an embodiment, the first passageway 90 has an inner surface that has a contact angle θ to the liquid of at most 45°.

Figure 21:
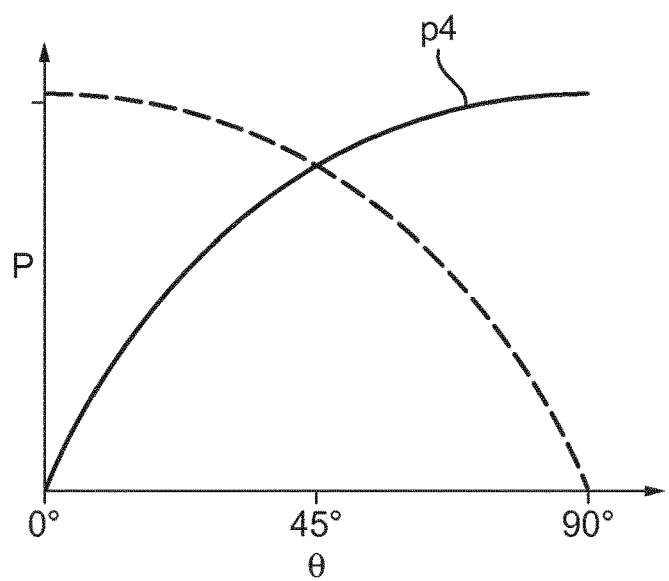
FIG. 21 is a graph showing a relationship between the contact angle of an inner surface of a passageway and a pressure in the passageway.

FIG. 21 is a graph showing the relationship between the contact angle θ of the inner surface of the first passageway 90 and the second pressure p2 (capillary pressure) in the first passageway 90 (shown by the dashed line on FIG. 21). As shown in FIG. 21, when the contact angle θ is greater, the second pressure p2 in the first passageway 90 is decreased p0.

FIG. 21 also shows the relationship between the contact angle θ and the minimum pressure p4 required for the liquid to move into the extraction channel 65. As shown in FIG. 21, when the contact angle θ is greater, the minimum pressure p4 required for the liquid to move into the extraction channel 65 is higher.

As shown in FIG. 21, the second pressure p2 in the first passageway 90 is greater than the minimum pressure p4 required for the liquid to move into the extraction channel 65 when the contact angle θ is at most 45°. In an embodiment the extraction body 67 is made from a material that has a contact angle to the liquid of at most 45°. In an embodiment the inner surface of the first passageway 90 is treated such that it has a contact angle to the liquid of at most 45°. For example, in an embodiment the inner surface of the first passageway 90 is coated with a coating that has a contact angle to the liquid of at most 45°. In an alternative embodiment the inner surface of the first passageway 90 comprises structures such that the inner surface has a contact angle to the liquid of at most 45°.

In an embodiment the first pressure p1 in the extraction channel 65 is controlled to be higher than the second pressure p2 and lower than the third pressure p3 at the meniscus of the liquid associated with surface tension of the liquid. This can be represented by the following inequality: p3>p1>p2.

For the example in which the diameter D of the first passageway 90 is 50 μm, the contact angle θ at the inner surface of the first passageway 90 is 0° and the contact angle α of the substrate W is 0°, then the third pressure p3=99.3 kPa (absolute pressure) and the second pressure p2=94.4 kPa (absolute pressure). This means that the first pressure p1 in the extraction channel 65 is controlled to be less than 99.3 kPa (absolute pressure) and greater than 94.4 kPa (absolute pressure). For example, the first pressure p1 in the extraction channel 65 can be controlled to be about 98.5 kPa (absolute pressure). The greater the difference between the third pressure p3 and the second pressure p2, the greater the range of values that the first pressure p1 can be controlled to be.

In order for it to be possible for the first pressure p1 to be less than the third pressure p3 and greater than the second pressure p2, the third pressure p3 must be greater than the second pressure p2. This provides the following inequality: p0−(cos θ+cos α)σ/h>p0−4σ cos θ/D. Rearranging this inequality provides the following inequality: D<4h cos θ/(cos α+cos θ). In an embodiment the diameter D of the first passageway 90 is sufficiently small relative to the vertical distance h between the extraction body 67 and the substrate W that the inequality is satisfied. The limitation on the diameter D depends in part on the contact angle α of the substrate W. Different substrates W may be used having different values for the contact angle α. It is desirable that the extraction body 67 is configured such that the inequality is satisfied for any substrate W. The greatest limitation on the diameter D would be provided if the material of the substrate W has a contact angle α to the liquid of 0°. In this case, the following inequality is provided: D<4h cos θ/(1+cos θ).

As depicted in FIG. 4, in an embodiment the object holder 61 comprises a plurality of burls 62 that protrude above the base surface of the object holder 61. Each of the plurality of burls 62 has a respective burl distal end. The burl distal ends are arranged in a support plane so as to support the substrate W. The bottom surface of the substrate W coincides with the support plane, provided that the bottom surface of the substrate W is flat.

In an embodiment the support table WT is arranged such that the following inequality is satisfied: D<4h cos θ/(1+cos θ). This can be done by selecting an appropriate material for the extraction body 67 and selecting an appropriate value for the diameter D of the first passageway 90 for example.

In an embodiment the extraction body 67 comprises a plurality of openings 91 and first passageways 90. The first passageways 90 may form narrowly spaced capillaries along the circumference, which have a connected underpressure at the extraction channel 65 so that the first passageways 90 stay wet. In an embodiment, any liquid that comes over the opening 91 is sucked away. Accordingly, the liquid may be prevented from reaching a region radially inward of the opening 91. However, if the flow capacity of the first passageway 90 is not large enough to prevent all of the liquid from reaching radially inward of the opening 91, then the underpressure created by the first passageway 90 and the extraction channel 65 limits how far the meniscus can reach.

As depicted in FIG. 4, in an embodiment a channel 92 is provided for fluidly communicating the first passageway 90 to the extraction channel 65. The channel 92 has a greater diameter than the first passageway 90. In an embodiment a channel 92 is provided for each of the first passageways 90. In an alternative embodiment, a single channel 92 is provided common for all of the first passageways 90. In an embodiment the opening 91 and the first passageway 90 form a continuous circumferential groove (rather than being separate narrowly spaced capillaries).

Figure 9:
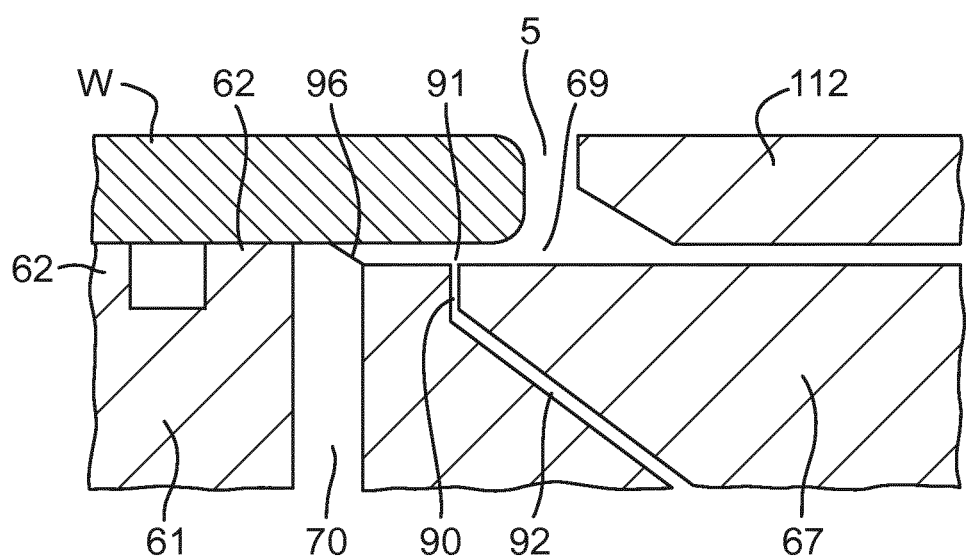
FIG. 9 schematically depicts a meniscus between the substrate and an extraction body according to an embodiment of the invention.

FIG. 9 schematically depicts in cross-section an extraction body 67 and an object holder 61 according to an embodiment of the invention. FIG. 9 depicts the limitation on how far the meniscus 96 can go on the substrate W radially inward of the opening 91. This is applicable when the fluid handling structure IH relatively stands over the edge of the substrate W for a while, and the allowable suction is limited by the amount of the liquid that may be extracted from the space 11 between the final element of the projection system PS and the support table WT or substrate W.

As depicted in FIG. 9, the meniscus 96 has a maximum radially inward position when the fluid handling structure IH relatively crosses over the edge of the substrate W and there is an abundance of the liquid. The intermediate space 70 between the object holder 61 and the extraction body 67 remains substantially dry.

As depicted FIG. 4, in an embodiment part of the extraction body 67 extends under the peripheral edge of the substrate W. The first passageway 90 is radially inward of the peripheral edge of the substrate W. As depicted in FIG. 9, in an embodiment the extraction body 67 comprises an edge at its upper, radially inward side configured to pin the meniscus 96 of the liquid. An embodiment of the invention is expected to reduce the amount of the liquid that reaches the intermediate space 70 between the object holder 61 and the extraction body 67.

Figure 10:
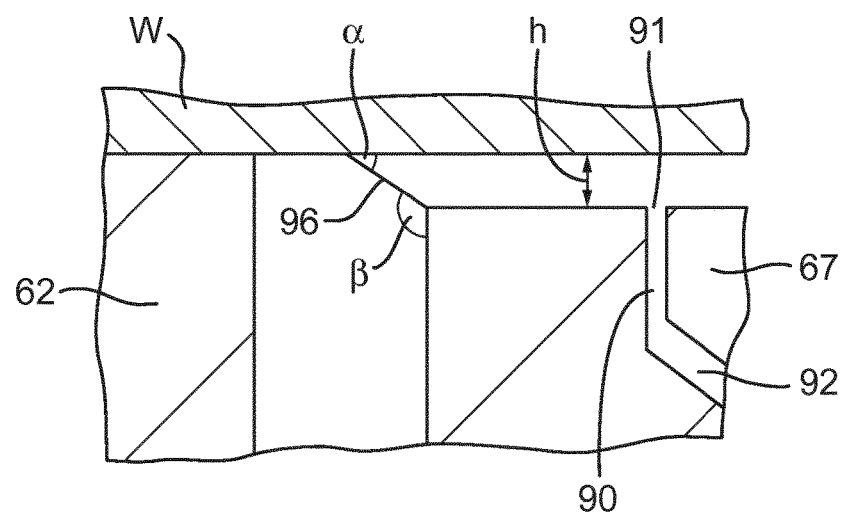
FIG. 10 schematically depicts a close-up of the meniscus shown in FIG. 9.

FIG. 10 schematically depicts in cross-section a close-up view of the pinned meniscus 96. FIG. 10 shows the contact angle α between the substrate W and the liquid. FIG. 10 also shows the contact angle β at the inner edge of the extraction body 67 to the liquid. In an embodiment the contact angle β at the inner edge of the extraction body 67 is large enough to prevent the meniscus 96 from extending further downwards because of the small ratio between the vertical distance h and the radial size of the meniscus 96. The radial size of the meniscus 96 is measured from the most radially inward point of the meniscus 96 to the most radially outward point of the meniscus 96.

Figure 5:
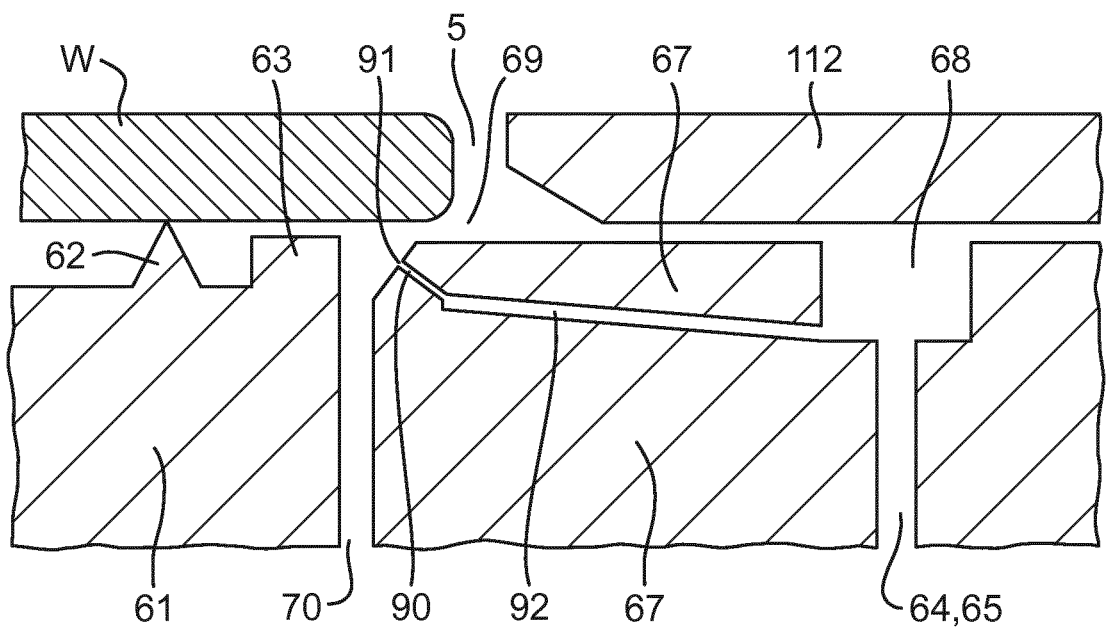
Figure 6:
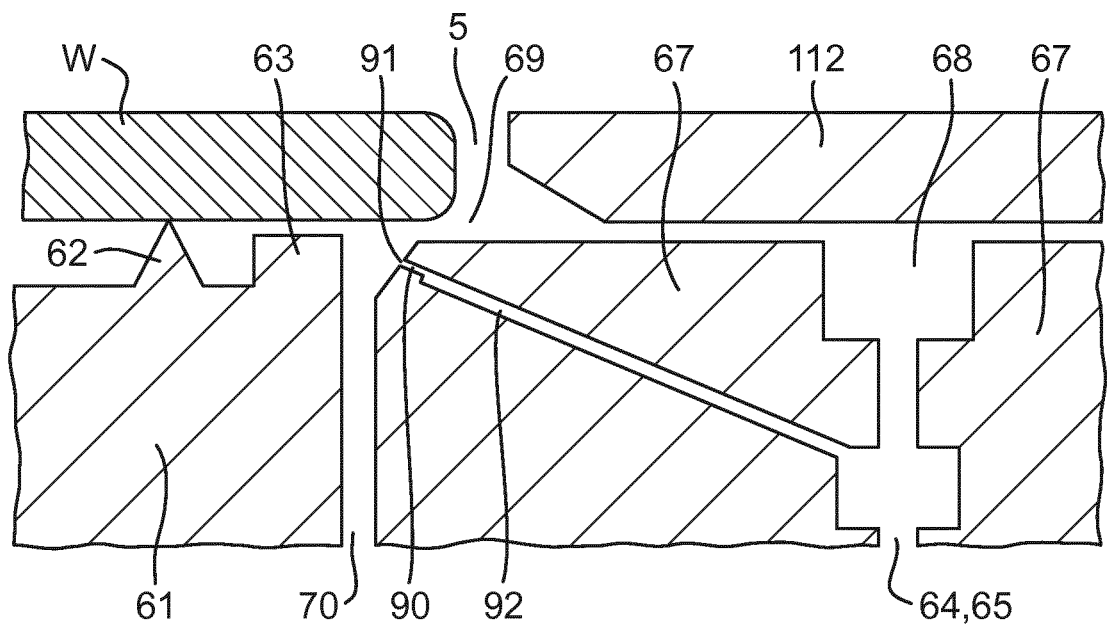

In an embodiment the edge at the upper, radially inward side of the extraction body 67 is sharp, as shown in FIG. 10. As depicted in FIGS. 4 to 6, in an embodiment the upper, radially inward side of the extraction body 67 comprises a chamfer. In an embodiment the edge of the chamfer is sharp so as to pin the meniscus 96 of the liquid.

In an embodiment the support table WT comprises a source of overpressure for supplying a flow of gas through the intermediate space 70 between the object holder 61 and the extraction body 67 towards the top surface 69 of the extraction body 67. A small overpressure is provided at the intermediate space 70, which is a radial gap.

As depicted in FIG. 4, in an embodiment the extraction body 67 comprises a second passageway 68. The second passageway 68 is radially outward of the first passageway 90. The second passageway 68 is configured to extract fluid from the surface 69 of the extraction body 67. In an embodiment the second passageway 68 is configure to remove bubbles when the fluid handling structure IH relatively crosses the edge of the substrate W.

As depicted in FIG. 4, in an embodiment the fluid extracted through the second passageway 68 is extracted via a further extraction channel 64. As depicted in FIG. 4, in an embodiment the extraction channel 65 connected to the first passageway 90 is separate from the further extraction channel 64 connected to the second passageway 68.

FIG. 5 depicts an alternative embodiment in which the extraction channel 65 is in fluid communication with both the first passageway 90 and the second passageway 68. This makes it possible to use one extraction channel 65 for two suction functions. The underpressure in the extraction channel 65 can be controlled and tuned for best performance of both suction functions.

FIG. 6 depicts an alternative embodiment that has an alternative connection option between the first passageway 90 and the extraction channel 65. In the embodiment shown in FIG. 5, the first passageway 90 is connected to the extraction channel 65 via the channel 92 that is only mildly inclined. In the embodiment showing in FIG. 6, the channel 92 is more severely inclined.

As depicted in FIG. 1, in an embodiment the support table WT comprises a controller 500 that is configured to control the source of underpressure connected to the extraction channel 65. In an embodiment the controller 500 is configured to control the source of underpressure so as to intermittently reduce the first pressure p1 in the extraction channel 65 to be lower than the second pressure p2 in the first passageway 90 associated with the surface tension of the liquid. The controller 500 is configured to perform pulsed suction with temporary high flow to extract bubbles through the first passageway 90 for short time intervals.

In an embodiment the radially inward surface of the extraction body 67 facing the object holder 61 is lyophobic.

In an embodiment the support table WT is configured to house a supply channel connectable to a source of overpressure (not shown in figures), wherein the supply channel is configured to supply a flow of gas to the intermediate space 70 between the object holder 61 and the extraction body 67.

As depicted in FIG. 4, in an embodiment the support table WT comprises a cover ring 112. The cover ring 112 is positioned at the top surface of the extraction body 67. By providing the cover ring 112 at the top of the extraction body 67 that would come into contact with the liquid controlled by the fluid handling structure IH in normal use, a thermal load in the extraction body 67 has a reduced thermal impact (via the liquid) on the fluid handling structure IH. A gap 5 is provided between the cover ring 112 and the substrate W when the substrate W is supported on the object holder 61. The top of the cover ring 112 is coplanar with the top of the substrate W.

Figure 11:
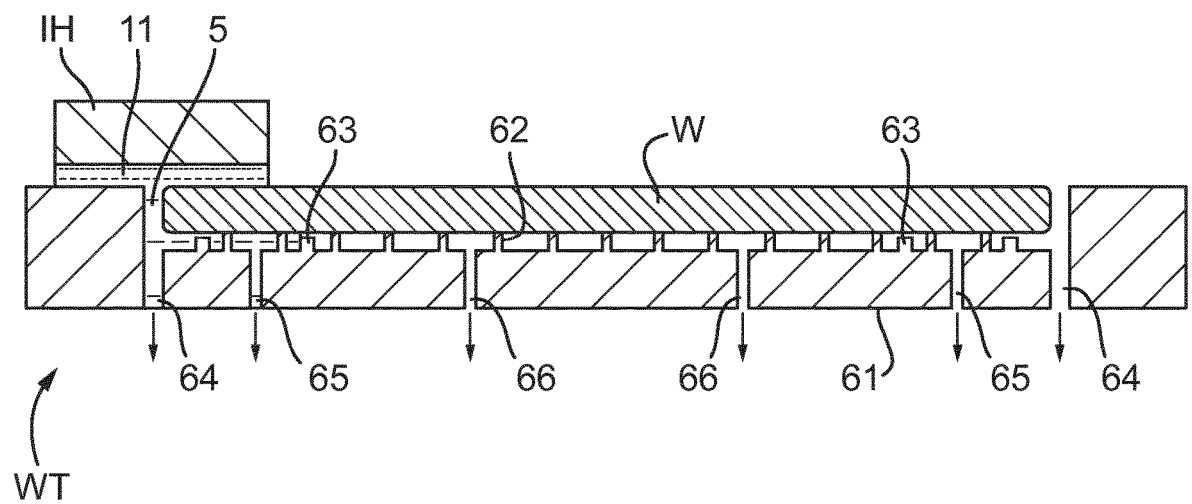
FIG. 11 schematically depicts a known support apparatus.

FIG. 11 schematically depicts in cross-section a known support table WT. The extraction channel 65 is designed to keep the liquid from flowing towards the back side of the substrate W. The further extraction channel 64 is designed to extract excess liquid and prevent bubbles in the space 11 between the final element of the projection system PS and the substrate W. An underpressure (a vacuum) is applied in the extraction channel 65. A slightly less deep vacuum is applied in the center part of the support table WT through the pre-clamp channels 66. The vacuum supply is controlled in such a way that the pressure difference between the extraction channel 65 and the center part of the support table WT stays the same.

A seal 63 is provided to prevent the liquid from reaching the center part of the back side of the substrate W. The seal 63 provides a small gap between the top of the seal 63 and the bottom of the substrate W. The pressure difference between the extraction channel 65 and the pre-clamp channels 66 is smaller than the force required to force the liquid through the gap between the seal 63 and the bottom of the substrate W. The meniscus of the liquid stabilises at the seal 63, which is radially inward of the extraction channel 65, as depicted in FIG. 11.

Relative to the arrangement shown in FIG. 11, an embodiment of the invention is expected to further limit the extent to which the liquid can reach the back side of the substrate W. As a result, there is more space at the periphery of the substrate W that stays dry. This means that additional burls 62 can be provided for supporting the outer periphery of the substrate W, which can improve flatness of the substrate W. This is possible because the outward most protrusions on the object holder 61 are kept dry in the present invention.

Liquid is prevented from reaching the pre-clamp channels 66. By providing a dry vacuum seal for the substrate W and dry burls 62, the normal force associated with the burls 62 is reduced. The burls 62 last longer because they experience less force when the lithographic apparatus is used. This also reduces contamination that can be transported radially inward to the burls 62 by the liquid.

As explained above, in an embodiment the flow through the extraction channel 65 can be low, which is good for reducing the thermal impact of flow in the extraction body 67. An embodiment of the invention is expected to limit the amount of the liquid left under the substrate W before a substrate exchange process is performed in which one substrate W is removed from the support table WT and another substrate W is put in its place.

In an embodiment the vertical distance h between the substrate W and the first passageway 90 is at most 200 μm, optionally at most 100 μm, and optionally at most 50 μm. Restricting the vertical distance between the substrate W and the extraction body 67 helps to limit the amount of liquid left under the substrate W before a substrate exchange process is performed. The vertical distance h is measured from the level of the bottom of the substrate W to the centre of the opening 91. Even if the surface is chamfered, the vertical distance h is measured vertically.

As depicted in FIGS. 4 to 6, the extraction body 67 is substantially decoupled from the object holder 61. The suction geometry is isolated from the object holder 61 that clamps the substrate W. An embodiment of the invention is expected to reduce the thermal fingerprint of the extraction channel 65 and the further extraction channel 64. However, it is not necessary for the extraction body 67 to be decoupled from the object holder 61. In an alternative embodiment, the extraction body 67 and the object holder 61 are made of a single piece.

Figure 12:
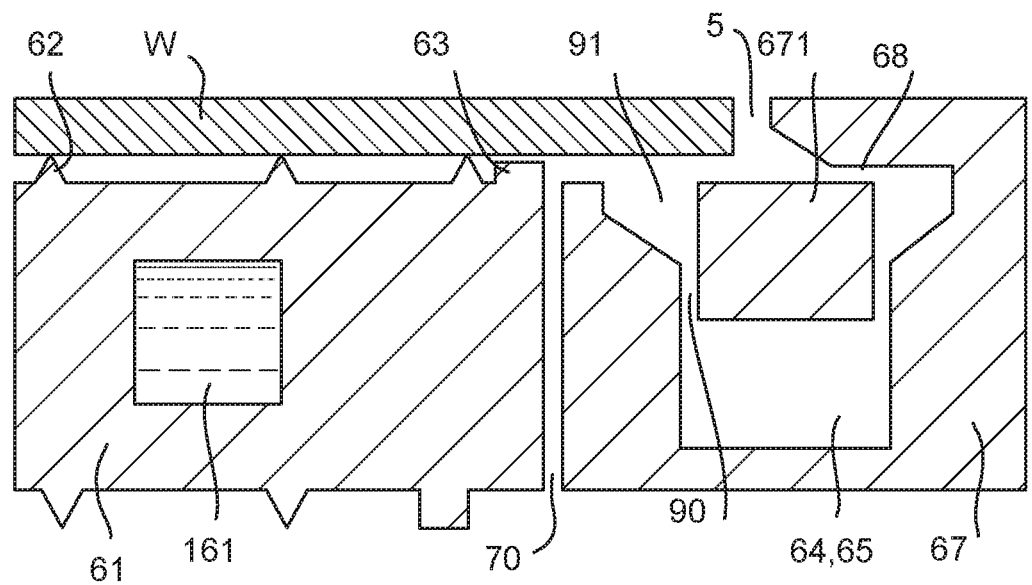
FIGS. 12 and 13 schematically depict in cross-section a support apparatus according to an embodiment of the invention.

FIG. 12 schematically depicts in cross-section an extraction body 67 with an object holder 61 according to an alternative embodiment of the invention. As depicted in FIG. 12, the support table WT comprises the object holder 61 and the extraction body 67. The extraction body 67 is spaced from the object holder 61 such that the extraction body 67 is substantially decoupled from the object holder 61. However, it is not necessary for the extraction body 67 to be decoupled from the object holder 61. In an alternative embodiment, the extraction body 67 and the object holder 61 are made of a single piece.

The extraction body 67 comprises the extraction channel 65 in the extraction body 67. The extraction channel 65 functions as both the extraction channel 65 connected to the opening 91 and the further extraction channel 64 connected to the second passageway 68. The opening 91 extends within the extraction body 67 and is in fluid communication with the extraction channel 65 via a first passageway 90. The first pressure p1 in the extraction channel 65 is less than the ambient pressure p0.

The extraction body 67 comprises the second passageway 68 radially outward of the first passageway 90. The second passageway 68 is configured to extract fluid from the surface of the extraction body 67. The extraction channel 65 is in fluid communication with both the first passageway 90 and the second passageway 68. The first passageway 90 and the second passageway 68 are unified by a single extraction channel 65.

As depicted in FIG. 12, in an embodiment the extraction body 67 comprises a circumferential ring section 671. As depicted in FIG. 12, in an embodiment the circumferential ring section 671 has a plateau at its top surface. The plateau is below the gap 5 between the edge of the substrate W and the extraction body 67. By keeping the plateau below the gap 5 the risk of bubbles in the space 11 between the final element of the protection system PS and the substrate W is reduced. In an embodiment the plateau at the top surface of the circumferential ring section 671 is about 50 μm from the substrate W.

An embodiment of the invention is expected to simplify the design of connections at the bottom of the support table WT. In particular, only one extraction channel 65 is present.

Figure 13:
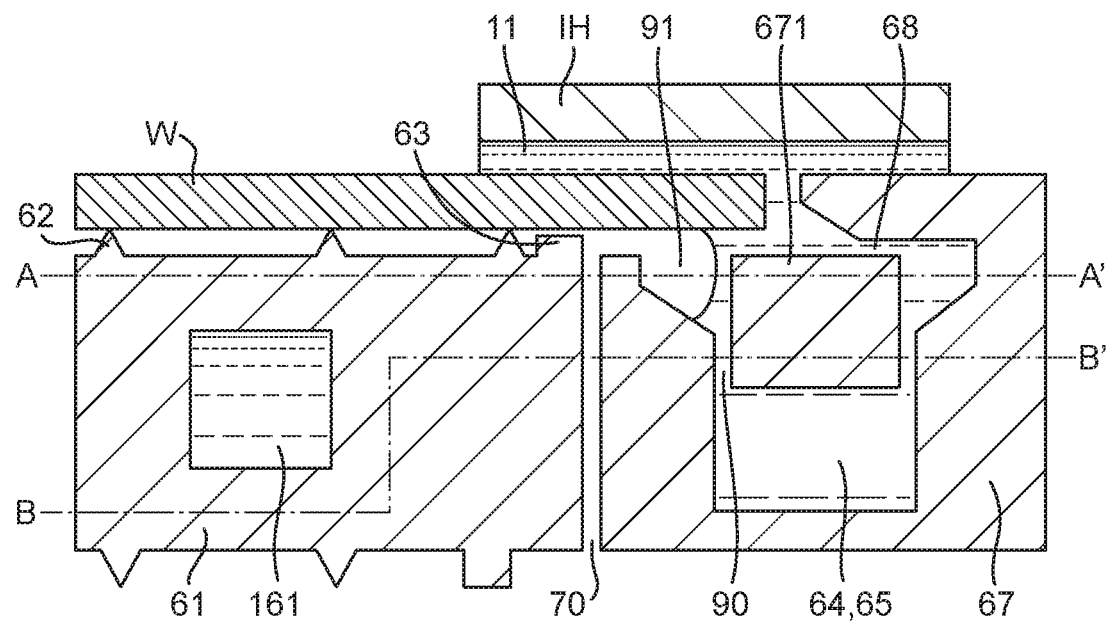
Figure 14:
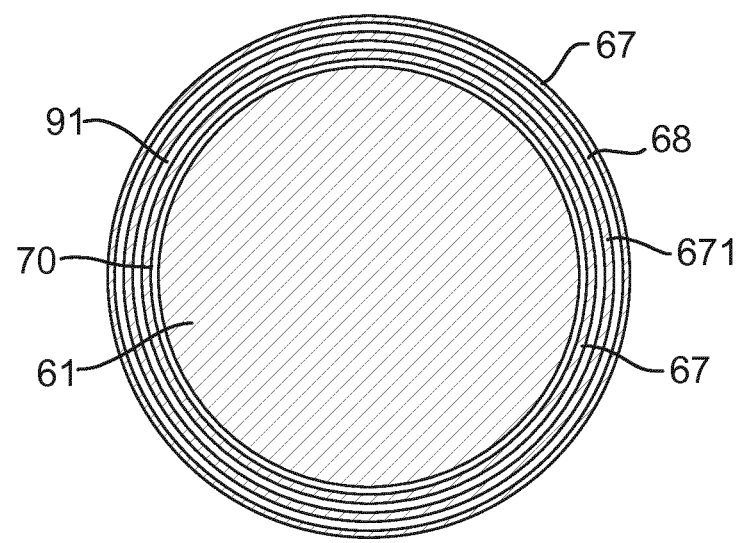
FIGS. 14 and 15 schematically depict in plan view a support apparatus according to an embodiment of the invention.
Figure 15:
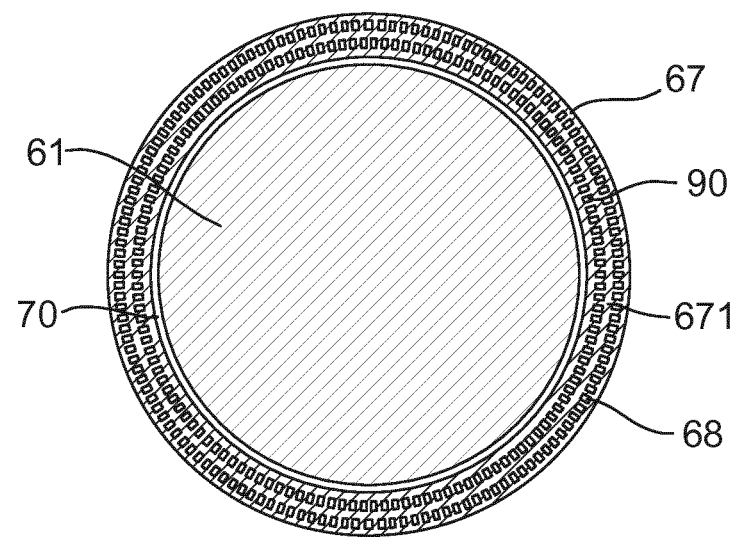

FIG. 13 shows the expected wetted parts during an exposure operation. FIGS. 14 and 15 schematically depict in plan view the construction of the object holder 61 and the extraction body 67 taken along the lines A-A' and B-B' respectively, shown in FIG. 13. As shown in FIGS. 13 to 15, in an embodiment the opening 91 extends circumferentially along the extraction body 67, e.g. as a groove or a channel. Similarly, the opening to the second passageway 68 extends circumferentially. The connections to the extraction channel 65 are a series of separate holes. The circumferential ring section 671 is thus integrally part of the extraction body 67.

As depicted in FIGS. 12 and 13, in an embodiment the object holder 61 comprises a network of fluid-carrying channels 161. The fluid-carrying channels 161 may be part of a thermal conditioning system configured to control the temperature of the object holder 61. The fluid-carrying channels 161 carry a thermal conditioning liquid, which may be water for example. The fluid-carrying channels 161 maintain the temperature of the object holder 61 at a certain (e.g. predetermined) temperature. In an embodiment, one or more heater/temperature sensors (not shown) may be positioned in or near the fluid-carrying channels 161 so as to control the temperature of the thermal conditioning liquid within the fluid-carrying channels 161. In an embodiment the thermal conditioning system comprises only heaters and sensors without any fluid-carrying channels 161.

Figure 22:
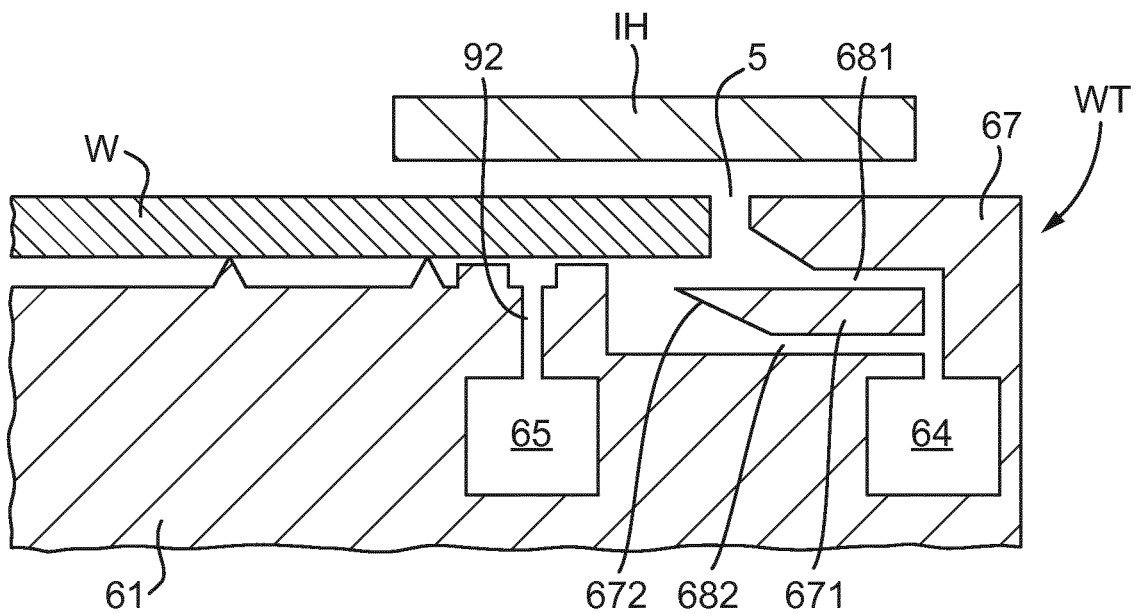
FIG. 22 schematically depicts a support apparatus according to an embodiment of the invention.

FIG. 22 schematically depicts in cross-section a support table WT according to an alternative embodiment of the invention. As depicted in FIG. 22, in an embodiment the extraction body 67 is connected to the object holder 61. The object holder 61 is not decoupled from the extraction body 67. However, in an alternative embodiment the object holder 61 is decoupled from the extraction body 67 (e.g. as shown in FIGS. 4 to 6, 12 and 13). A channel 92 is configured to extract liquid from below the substrate W into the extraction channel 65. The further extraction channel 64 is connected to two different passageways. The further extraction channel 64 is connected to the upper passageway 681 and the lower passageway 682. As depicted in FIG. 22, in an embodiment the ring section 671 is configured such that at least part of the upper passageway 681 extends above the ring section 671 and at least part of the lower passageway 682 extends below the ring section 671.

In the configuration of FIG. 22, the liquid is more likely to pin on top of the ring section 671. The liquid that is in contact with the substrate W has a capillary force component acting on it towards the channel 92 and extraction channel 65 (provided that the substrate W is hydrophilic). By providing the configuration of the upper passageway 681 and the lower passageway 682, the meniscus is less likely to advance towards the channel 92 and extraction channel 65. In an embodiment the radially inward surface 672 of the ring section 671 is lyophobic so as to enhance this effect. The channel 92 and the extraction channel 65 are optional features. In an alternative embodiment the channel 92 and the extraction channel 65 are not provided.

FIGS. 23 to 26 each depict variations of the geometry of the ring section 671. In FIG. 22, the circumferential ring section 671 comprises a chamfer at its radially inward side, wherein a radially inward surface 672 of the ring section 671 continuously tapers radially outwards in a downwards direction along the vertical extent of the circumferential ring section 671.

Figure 23:
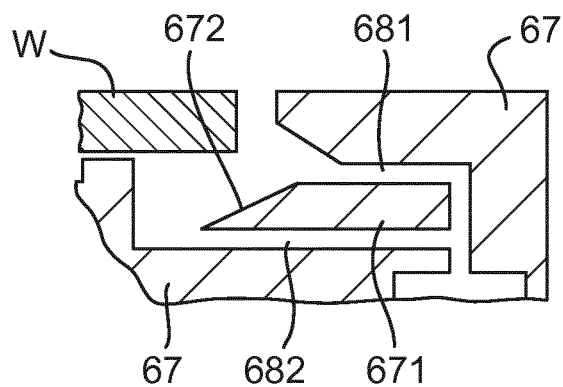
FIGS. 23 to 26 each depict schematically variations of part of the support apparatus according to an embodiment of the invention.

In the alternative arrangement shown in FIG. 23, the circumferential ring section 671 comprises a chamfer at its radially inward side, wherein the radially inward surface 672 of the circumferential ring section 671 continuously tapers radially inwards in a downwards direction along the vertical extent of the circumferential ring section 671. This design reduces the possibility that the liquid may drop down from the circumferential ring section 671 and not connect to the lower passageway 682.

In an embodiment the lower passageway 682 is formed as a slit under the circumferential ring section 671. If liquid drops down from the circumferential ring section 671 and does not connect to the lower passageway 682, then this can leave behind droplets of the liquid that could induce an undesirable evaporative load. Because of this risk, the chamfer can be inverted as shown in FIG. 23. Any liquid tipping over the sharp edge will immediately be sucked into the lower passageway 682 under the circumferential ring section 671.

Figure 24:
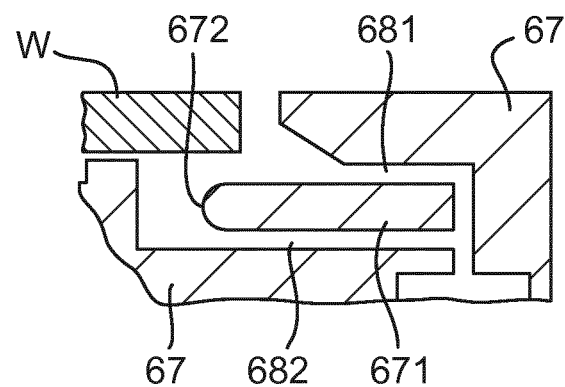

As depicted in FIG. 24, in an embodiment the circumferential ring section 671 comprises a rounded edge at its radially inward side. This design reduces (relative to the configuration shown in FIG. 23) the volume of the liquid that can stand on top of the circumferential ring section 671. This means that less water is extracted from the fluid handling structure IH. There is a possibility that the meniscus of the liquid of the substrate side can come undesirably close to the channel 92 and the extraction channel 65. By providing the rounded edge, the meniscus of the liquid can be prevented from going so close to the channel 92, while still producing the possibility of the liquid dropping down from the circumferential ring section 671 and not reaching the lower passageway 682. A rounded edge is easier to manufacture than a sharp edge. A rounded edge is more durable than a sharp edge.

Figure 25:
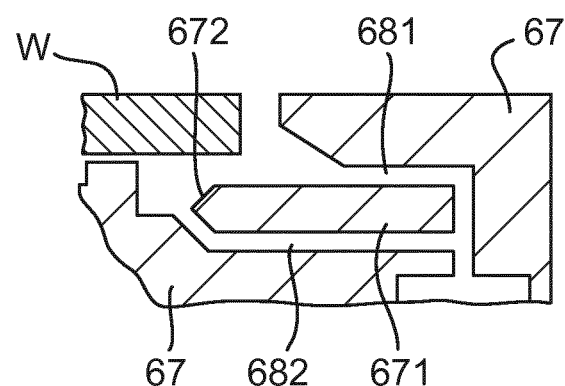

FIG. 25 depicts a variation of the embodiment shown in FIG. 24. In the embodiment shown in FIG. 25, the circumferential ring section 671 comprises a chamfer at its radially inward side, wherein the radially inward surface 672 of the circumferential ring section 671 initially tapers radially inwards and then tapers radially outwards in a downwards direction along the vertical extent of the circumferential ring section 671. As depicted in FIG. 25, the extraction body 67 can be shaped such that the lower passageway 682 extends along the bottom half of the chamfer at the radially inward side of the circumferential ring section 671.

Figure 26:
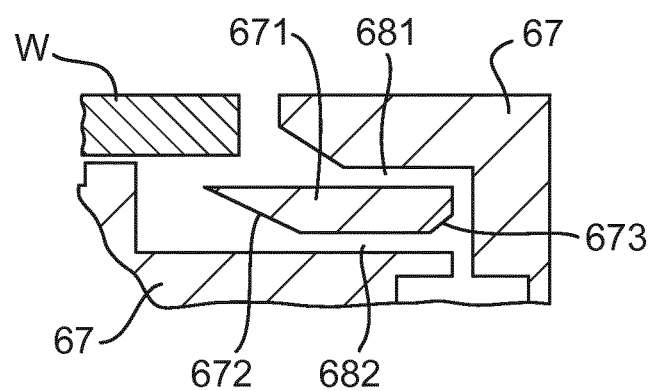

As depicted in FIG. 26, in an embodiment the circumferential ring section 671 comprises a chamfer 673 at its radially outward bottom edge. The chamfer 673 is beneficial for the removal of liquid from the region radially inward of the circumferential ring section 671.

In an embodiment the top of the circumferential ring section 671 is in the region of about 20 μm to about 100 μm from the bottom of the substrate W. For example, the vertical distance between the substrate W and the top of the circumferential ring section 671 may be about 50 μm.

In an embodiment the support table WT comprises a controller 500 (shown in FIG. 1) configured to control flow through the lower passageway 682 and the upper passageway 681. In an embodiment the extraction body 67 is arranged such that a significant amount (e.g. about 50%) of the flow to the further extraction channel 64 is via the lower passageway 682. This is expected to reduce the possibility of the liquid reaching the channel 92 and the extraction channel 65.

In an alternative embodiment, the extraction body 67 is arranged such that a low flow is provided through the lower passageway 682. In an embodiment only about 10% or less of the total flow to the further extraction channel 64 is through the lower passageway 682. This way, liquid entering the lower passageway 682 will not be removed but stay there and act as a capillary that connects bodies of liquid radially inward and radially outward of the circumferential ring section 671. This helps to ensure the removal of liquid from the position radially inward of the circumferential ring section 671.

By balancing the pressure drop over the upper passageway 681, the lower passageway 682 and the gap between the circumferential ring section 671 and the substrate W, it is possible to determine the required geometrical properties of the lower passageway 682 in order to provide the low flow and high flow through the lower passageway 682 mentioned above. Merely as an example, in order to provide the high flow (about 50% of the total flow) through the lower passageway 682, the lower passageway 682 may have a height of about 100 μm and a radial length of about 1.6 mm. For the low flow (less than 10%) through the lower passageway 682, the lower passageway 682 may have a height of about 30 μm and a radial length of about 2.1 mm (or more).

In an embodiment, there is provided an extraction body for a support apparatus of a lithographic apparatus, the support apparatus configured to support an object, wherein the extraction body is formed with an opening at a surface thereof, the opening extending within the extraction body forming a first passageway, and the first passageway configured to fluidly communicate an extraction channel in the extraction body to liquid between the surface and the object, wherein a first pressure in the extraction channel is less than ambient pressure; characterized in that at least a part of the first passageway is sized and dimensioned such that when the liquid enters the first passageway via the opening, a second pressure in the first passageway associated with surface tension of the liquid is lower than the first pressure such that at least a portion of the liquid is retained in the first passageway.

In an embodiment, the extraction body is configured such that the first pressure is lower than a third pressure at a meniscus of the liquid associated with surface tension of the liquid, such that the liquid can be removed through the first passageway into the extraction channel. In an embodiment, part of the extraction body extends under a peripheral edge of the object, and the first passageway is radially inward of the peripheral edge, and/or wherein the extraction body further comprises an edge at its upper, radially inward side configured to pin a meniscus of liquid. In an embodiment, the opening and the first passageway forms a continuous circumferential groove. In an embodiment, the extraction body further comprises a second passageway radially outward of the first passageway and configured to extract fluid from the surface of the extraction body. In an embodiment, the extraction channel is in fluid communication with both the first passageway and the second passageway. In an embodiment, the extraction body further comprises a circumferential ring section configured such that at least part of a lower passageway extends below the ring section and at least part of an upper passageway extends over the ring section. In an embodiment, the circumferential ring section comprises a chamfer at its radially inward side, a radially inward surface of the circumferential ring section continuously tapers radially outwards or inwards in a downwards direction along the vertical extent of the circumferential ring section, or a radially inward surface of the circumferential ring section initially tapers radially inwards and then tapers radially outwards in a downwards direction along the vertical extent of the circumferential ring section. In an embodiment, the circumferential ring section comprises a rounded edge at its radially inward side and/or at its radially outward bottom edge.

In an embodiment, there is provided a support apparatus for a lithographic apparatus, comprising: an object holder comprising a plurality of burls protruding above a base surface thereof, each of the plurality of burls having a respective burl distal end, the burl distal ends arranged in a support plane so as to support an object; and an extraction body as disclosed herein, wherein the extraction body is radially outward of the object holder and is spaced from the object holder such that the extraction body is substantially decoupled from the object holder.

In an embodiment, a radially inward surface of the extraction body facing the support apparatus is lyophobic. In an embodiment, the support apparatus is arranged such that D<4 h cos θ/(1+cos θ) and θ≤45°, where D is a diameter of the first passageway, h is a minimum distance between the first passageway and the support plane and θ is a contact angle to the liquid of an inner surface of the first passageway In an embodiment, there is provided a lithographic apparatus comprising a support apparatus as disclosed herein.

In an embodiment, there is provided a method of supporting an object on a support apparatus comprising an object holder configured to support the object and an extraction body radially outward of the object holder and spaced from the object holder such that the extraction body is substantially decoupled from the object holder, the method comprising: extracting a liquid through a first passageway of the extraction body to an extraction channel in the extraction body, wherein the liquid enters the first passageway via an opening at a surface of the extraction body, the opening extending within the extraction body forming the first passageway; wherein a first pressure in the extraction channel is less than ambient pressure; wherein at least a part of the first passageway is sized and dimensioned such that when the liquid enters the first passageway via the opening, a second pressure in the first passageway associated with surface tension of the liquid is lower than the first pressure such that at least a portion of the liquid is retained in the first passageway.

In an embodiment, there is provided a device manufacturing method using a lithographic apparatus, the method comprising: projecting a beam patterned by a patterning device onto a substrate while supporting the substrate with a support apparatus, wherein the support apparatus comprises: an object holder configured to support an object; and an extraction body radially outward of the object holder, the extraction body comprising a first passageway configured to extract a liquid to an extraction channel in the extraction body, wherein the liquid enters the first passageway via an opening at a surface of the extraction body, the opening extending within the extraction body forming the first passageway; wherein a first pressure in the extraction channel is less than ambient pressure; wherein at least a part of the first passageway is sized and dimensioned such that when the liquid enters the first passageway via the opening, a second pressure in the first passageway associated with surface tension of the liquid is lower than the first pressure such that at least a portion of the liquid is retained in the first passageway.

As will be appreciated, any of the above-described features can be used with any other feature and it is not only those combinations explicitly described which are covered in this application.

As will be appreciated, any of the above described features can be used with any other feature and it is not only those combinations explicitly described which are covered in this application. For example, an embodiment of the invention could be applied to the embodiment of FIG. 3. Furthermore, although embodiments of the invention have been described above in the context of an immersion lithographic apparatus for convenience, it will be appreciated that an embodiment of the invention may be used in conjunction with any form of lithographic apparatus.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An extraction body for a support apparatus of a lithographic apparatus, the support apparatus configured to support an object,
   wherein the extraction body is formed with an opening at a surface thereof,
   wherein a first passageway extends within the extraction body from the opening and the first passageway is configured to fluidly communicate an extraction channel in the extraction body to liquid between the surface and the object,
   wherein, in a use of the extraction body, a first pressure in the extraction channel is less than ambient pressure, and
   wherein at least a part of the first passageway is sized and dimensioned such that when the liquid enters the first passageway via the opening, a second pressure in the first passageway associated with surface tension of the liquid is lower than the first pressure while the first passageway is exposed to the first pressure such that at least a portion of the liquid is retained in the first passageway despite an underpressure in the extraction channel sufficient to remove all of the liquid at the opening through the opening and the first passageway.

2. The extraction body of claim 1, wherein the extraction body is configured such that the first pressure is lower than a third pressure at a meniscus of the liquid associated with surface tension of the liquid, such that the liquid can be removed through the first passageway into the extraction channel.

3. The extraction body of claim 1, wherein part of the extraction body extends under a peripheral edge of the object, and the first passageway is radially inward of the peripheral edge, and/or wherein the extraction body further comprises an edge at its upper, radially inward side configured to pin a meniscus of liquid.

4. The extraction body of claim 1, wherein the opening and the first passageway forms a continuous circumferential groove.

5. The extraction body of claim 1, wherein the extraction body further comprises a second passageway radially outward of the first passageway and configured to extract fluid from the surface of the extraction body.

6. The extraction body of claim 5, wherein the extraction channel is in fluid communication with both the first passageway and the second passageway.

7. The extraction body of claim 5, further comprising a circumferential ring section configured such that at least part of a lower passageway extends below the ring section and at least part of an upper passageway extends over the ring section.

8. The extraction body of claim 7, wherein the circumferential ring section comprises a chamfer at its radially inward side, or wherein a radially inward surface of the circumferential ring section continuously tapers radially outwards or inwards in a downwards direction along the vertical extent of the circumferential ring section, or wherein a radially inward surface of the circumferential ring section initially tapers radially inwards and then tapers radially outwards in a downwards direction along the vertical extent of the circumferential ring section.

9. The extraction body of claim 7, wherein the circumferential ring section comprises a rounded edge at its radially inward side and/or at its radially outward bottom edge.

10. A support apparatus for a lithographic apparatus, the support apparatus comprising:
    an object holder comprising a plurality of burls protruding above a base surface thereof, each of the plurality of burls having a respective burl distal end, the burl distal ends arranged in a support plane so as to support an object; and
    the extraction body of claim 1, wherein the extraction body is radially outward of the object holder and is spaced from the object holder such that the extraction body is substantially decoupled from the object holder.

11. The extraction body of claim 10, wherein a radially inward surface of the extraction body facing the support apparatus is lyophobic.

12. The extraction body of claim 10, wherein the support apparatus is arranged such that $D < 4h\cos\theta/(1+\cos\theta)$ and $\theta \leq 45°$, where D is a diameter of the first passageway, h is a minimum distance between the first passageway and the support plane and $\theta$ is a contact angle to the liquid of an inner surface of the first passageway.

13. A lithographic apparatus comprising the support apparatus of claim 10.

14. A method of supporting an object on a support apparatus comprising an object holder configured to support the object and an extraction body radially outward of the object holder, the method comprising:
    extracting a liquid through a first passageway of the extraction body to an extraction channel in the extraction body,
    wherein the liquid enters the first passageway via an opening at a surface of the extraction body,
    wherein the first passageway extends within the extraction body from the opening,
    wherein a first pressure in the extraction channel is less than ambient pressure, and
    wherein at least a part of the first passageway is sized and dimensioned such that when the liquid enters the first passageway via the opening, a second pressure in the first passageway associated with surface tension of the liquid is lower than the first pressure such that at least a portion of the liquid is retained in the first passageway despite an underpressure in the extraction channel sufficient to remove all of the liquid at the opening through the opening and the first passageway.

15. A device manufacturing method using a lithographic apparatus, the method comprising:
    projecting a beam patterned by a patterning device onto a substrate while supporting the substrate with a support apparatus; and
    performing the method of claim 14.

16. The method of claim 14, wherein the extraction body is spaced from the object holder such that the extraction body is substantially decoupled from the object holder.

17. An extraction body for a support apparatus of a lithographic apparatus, the support apparatus configured to support an object, the extraction body having an opening at a surface thereof,
    wherein a first passageway extends within the extraction body from the opening and the first passageway is configured to fluidly communicate an extraction channel in the extraction body to liquid between the surface and the object, and
    wherein at least a part of the first passageway having a wall formed from the extraction body, is sized and dimensioned such that when the liquid enters the first passageway via the opening, the at least part of the first passageway at the opening remains wet despite the presence of an underpressure in the extraction channel forcing all the liquid at the opening through the opening and the first passageway.

18. The extraction body of claim 17, wherein part of the extraction body extends under a peripheral edge of the object, and the first passageway is radially inward of the peripheral edge, and/or wherein the extraction body further comprises an edge at its upper, radially inward side configured to pin a meniscus of liquid.

19. The extraction body of claim 17, wherein the opening and the first passageway forms a continuous peripheral groove.

20. The extraction body of claim 17, wherein the extraction body further comprises a second passageway radially outward of the first passageway and configured to extract fluid from the surface of the extraction body.

* * * * *